United States Patent
Chen et al.

(10) Patent No.: US 9,317,650 B2
(45) Date of Patent: Apr. 19, 2016

(54) DOUBLE PATTERNING TECHNOLOGY (DPT) LAYOUT ROUTING

(71) Applicant: Taiwan Semiconductor Manufacturing Company Limited, Hsin-Chu (TW)

(72) Inventors: Huang-Yu Chen, Zhudong Township (TW); Fang-Yu Fan, Hukou Township (TW); Yuan-Te Hou, Hsinchu (TW); Wen-Hao Chen, Hsin-Chu (TW); Chung-Hsing Wang, Baoshan Township (TW); Yi-Kan Cheng, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 36 days.

(21) Appl. No.: 14/496,053

(22) Filed: Sep. 25, 2014

(65) Prior Publication Data

US 2015/0012895 A1    Jan. 8, 2015

Related U.S. Application Data

(62) Division of application No. 13/753,815, filed on Jan. 30, 2013, now Pat. No. 8,850,368.

(51) Int. Cl.
    *G06F 17/50*  (2006.01)
(52) U.S. Cl.
    CPC ........ *G06F 17/5081* (2013.01); *G06F 17/5077* (2013.01)

(58) Field of Classification Search
    CPC . G06F 17/50; G06F 17/5081; G06F 17/5068; G06F 2217/12; G03F 7/70466; H01L 21/0338; H01L 21/31144
    USPC ..................... 716/50–55; 430/5, 30
    See application file for complete search history.

(56) References Cited

U.S. PATENT DOCUMENTS

2011/0318927 A1*  12/2011  Li ............................ G03F 1/36
                                                            438/692

* cited by examiner

*Primary Examiner* — Nghia Doan
(74) *Attorney, Agent, or Firm* — Cooper Legal Group, LLC

(57) ABSTRACT

One or more techniques or systems for determining double patterning technology (DPT) layout routing compliance are provided herein. For example, a layout routing component of a system is configured to assign a pin loop value to a pin loop. In some embodiments, the pin loop value is assigned based on a mask assignment of a pin of the pin loop. In some embodiments, the pin loop value is assigned based on a number of nodes associated with the pin loop. DPT compliance or a DPT violation is determined for the pin loop based on the pin loop value. In this manner, odd loop detection associated with DPT layout routing is provided because a DPT violation results in generation of an additional instance of a net, for example. Detecting an odd loop allows a design to be redesigned before fabrication, where the odd loop would present undesired issues.

20 Claims, 9 Drawing Sheets

DOUBLE PATTERNING TECHNOLOGY (DPT) LAYOUT ROUTING

RELATED APPLICATIONS

This application is a divisional application of and claims priority to U.S. Non-Provisional patent application Ser. No. 13/753,815, filed on Jan. 30, 2013, which is incorporated herein by reference.

BACKGROUND

Generally, a layout router facilitates layout of pins within a semiconductor device. For example, a layout router places a circuit element at a location within an integrated circuit (IC), where the circuit element is connected to one or more pins. The layout router creates a layout based on a set of design rules. For example, terminals of a same net are connected. Additionally, terminals associated with different nets are not connected, etc. However, routing becomes challenging with more advanced technology.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for determining double patterning technology (DPT) compliance or DPT layout routing are provided herein. For example, a layout router or a router is configured to support odd loop detection for pre-colored pins and associated nets. In some scenarios, when a first net and a second net are spaced closer than a lithography limit, the first net is assigned to a first mask, and the second net is assigned to a second mask, thus mitigating the lithography limit issue. However, when a third net is located closer than the lithography limit to the first net and the second net, an undesirable odd loop is formed. In some embodiments, pre-colored pins are pins associated with a mask assignment. In a first scenario, a layout router is configured to create a pin loop based on a first pin associated with a first net, a second pin associated with a second net, and a conflict space associated with both the first net and the second net. The pin loop is a mechanism that facilitates finding of undesirable odd loops. A net is an electrical connection to a pin. Additionally, the layout router is configured to assign a pin loop value to the pin loop based on a mask assignment for the first pin or a mask assignment for the second pin. For example, if the first pin and the second pin share a same mask assignment, an even pin loop value is assigned to the corresponding pin loop. Conversely, if the first pin and the second pin are associated with different mask assignments, an odd pin loop value is assigned to the pin loop. The layout router is configured to determine a DPT compliance or a DPT violation for the pin loop based on the pin loop value. It will be appreciated that the layout router supports odd loop checking for pre-colored pins because the pin loop value is assigned based on mask assignments of pins associated with the pin loop.

In a second scenario, the layout router is configured to create a first pin group based on a mask assignment for one or more pins of the first pin group. Additionally, the first pin group is created based on one or more first internal conflict spaces between pins of the first pin group. Additionally, the layout router is configured to create a second pin group in a similar fashion. The layout router is configured to associate the first pin group or the second pin group with a first phantom assisted feature (AF) mask or a second phantom AF mask. In some embodiments, the layout router is configured to generate a first net for a pin of the first pin group or a second net for a pin of the second pin group. The layout router is configured create a pin loop based on the first net, the second net, the first phantom AF mask, the second phantom AF mask, first internal conflict spaces, or second internal conflict spaces. The layout router is configured to assign a pin loop value to the pin loop based on a number of nodes associated with the pin loop. Additionally, the layout router is configured to determine a DPT compliance or a DPT violation based on the pin loop value. The layout router supports odd loop checking for pre-colored pins because the first phantom AF mask or the second phantom AF mask compensate for the pre-colored pins during pin loop analysis.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
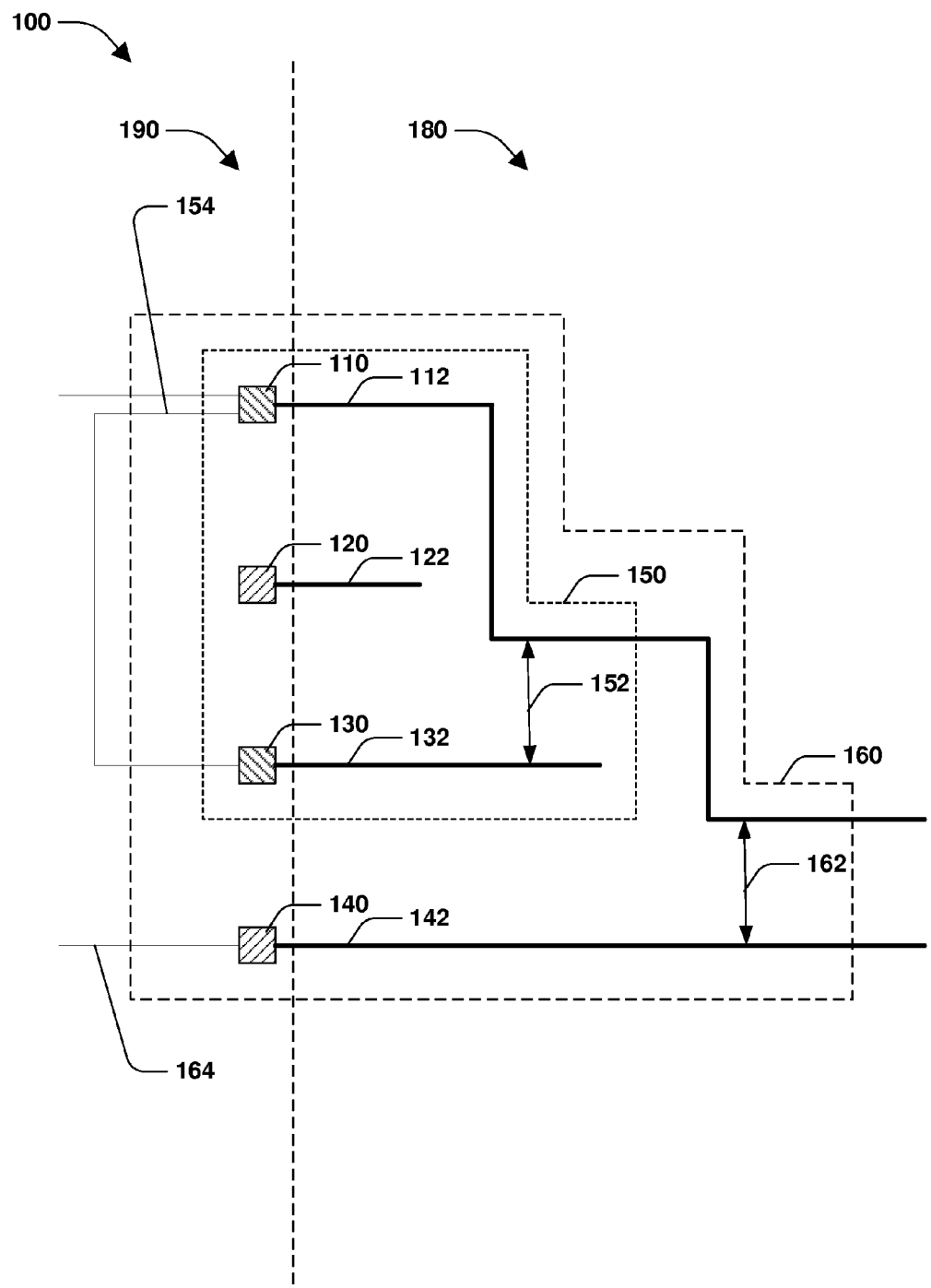
FIG. 1 is a schematic diagram of an example layout associated with a layout router configured for double patterning technology (DPT) routing, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that for at least some of the figures herein, one or more boundaries, such as boundary 150 or 160 of FIG. 1, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, where a boundary is associated with an irregular shape, the boundary, such as a box drawn with a dashed line, dotted lined, etc., does not necessarily encompass an entire component in some instances. Conversely, a drawn box does not necessarily encompass merely an associated component, in some instances, but encompasses at least a portion of one or more other components as well.

FIG. 1 is a schematic diagram 100 of an example layout associated with a layout router configured for double patterning technology (DPT) routing, according to some embodiments. For example, a layout is associated with an internal pin region 190 and a net region 180. The internal pin region 190 is associated with one or more pins. In FIG. 1, the internal pin region 190 is associated with a first pin 110, a second pin 120, a third pin 130, and a fourth pin 140. Pins within the internal pin region 190 are associated with a corresponding net, where a net pertains to a grouping of internal circuitry, such as grouped based upon functionality, for example. In the illustrated example, the first pin 110 is associated with a first net 112. Similarly, the second pin 120 is associated with a second net 122, the third pin 130 is associated with a third net 132, and the fourth pin 140 is associated with a fourth net 142, etc.

In some embodiments, the layout router is configured to generate the respective nets for the pins. For example, the layout router is configured to generate the first net 112 for the first pin 110, the second net 122 for the second pin 120, the third net 132 for the third pin 130, or the fourth net 142 for the fourth pin 140. During layout routing, a conflict space occurs when a distance between a first object and a second object is less than a lithography limit. For example, an object is a net, a pattern, a polygon, etc. Accordingly, it will be appreciated that a layout router is configured to assign the first object a first mask assignment and the second object a second mask assignment to resolve the conflict space, in some embodiments. In the example illustrated in FIG. 1, a first conflict space 152 is associated with the first net 112 and the third net 132. Additionally, a second conflict space 162 is associated with the first net 112 and the fourth net 142. In the illustrate example, the first pin 110 and the third pin 130 are associated with a mask assignment to a first mask, as indicated by the cross hatching. Additionally, the second pin 120 and the fourth pin 140 are associated with a mask assignment to a second mask.

In some embodiments, the layout router is configured to create a pin loop based on at least one of a first pin associated with a first net, a second pin associated with a second net, or a conflict space associated with the first net and the second net. For example, in FIG. 1, the layout router is configured to create a first pin loop 150 based on the first pin 110, the first net 112, the third pin 130, the third net 132, and the first conflict space 152. In greater detail, since the first conflict space 152 is between the first net 112 and the third net 132 and nets 112 and 132 are associated with pins 110 and 130, respectively, the layout router is configured to create the first pin loop 150 such that the first pin loop 150 surrounds a perimeter associated with respective elements. In other words, the first pin loop 150 'closes' a loop from the first pin 110 to the first net 112, to the first conflict space 152, to the third net 132, to the third pin 130, and back to the first pin 110. It will be appreciated that a second pin loop 160 is created in a similar fashion. For example, the second pin loop 160 comprises a path from the first pin 110 to the first net 112, to the second conflict space 162, to the fourth net 142, to the fourth pin 140, back to the first pin 110.

In some embodiments, the layout router is configured to assign a pin loop value to the pin loop based on at least one of a mask assignment for the first pin or a mask assignment for the second pin. In FIG. 1, the layout router is configured to assign a pin loop value to the first pin loop 150 based on the first pin 110 and the third pin 130 being associated with a mask assignment to a first mask, or rather a mask used in fabricating the first pin 110 or the second pin 130, such as during lithography, for example. Since the first pin 110 and the third pin 130 are associated with a same mask assignment to the first mask, the layout router is configured to assign a pin loop value of zero or an even pin loop value. In other words, the layout router is configured to assign the pin loop value to zero or an even pin loop value based on a same mask assignment between a first pin and a second pin. At 154, a virtual short is seen between the first pin 110 and the third pin 130 because the first pin 110 and the third pin 130 are associated with a same mask assignment to mask one. In some embodiments, the layout router is configured to assign a pin loop value based on a virtual short between a first pin and a second pin. For example, the layout router is configured to assign a pin loop a pin loop value of zero or an even pin loop value when a virtual short, such as 154, is associated with the pin loop. Accordingly, the layout router is configured to assign the first pin loop 150 a pin loop value of zero or an even pin loop value because the first pin loop 150 comprises the virtual short 154.

Additionally, the layout router is configured to assign a pin loop value to the second pin loop 160 based on the first pin 110 associated with a mask assignment to the first mask and the fourth pin 140 associated with a mask assignment to a second mask. Since the first pin 110 and the fourth pin 140 are associated with different mask assignments, the layout router is configured to assign a pin loop value of one or an odd pin loop value. In other words, the layout router is configured to assign the pin loop value to one or an odd pin loop value based on a different mask assignment between a first pin and a second pin. At 164, a virtual open is seen between the first pin 110 and the fourth pin 140 because the first pin 110 and the fourth pin 140 are associated with different mask assignments. In some embodiments, the layout router is configured to assign a pin loop value based on a virtual open between a first pin and a second pin. For example, the layout router is configured to assign a pin loop a pin loop value of one or an odd pin loop value when a virtual open, such as 164, is associated with the pin loop. Accordingly, the layout router is configured to assign the second pin loop 160 a pin loop value of one or an odd pin loop value because the second pin loop 160 comprises the virtual open 164.

In some embodiments, the layout router is configured to determine at least one of a double patterning technology (DPT) compliance for the pin loop or a DPT violation for the pin loop based on the pin loop value. In FIG. 1, the layout router is configured to determine a DPT compliance for the second pin loop 160 and a DPT violation for the first pin loop 150, because the first pin loop 150 is assigned a pin loop value of zero and the second pin loop 160 is assigned a pin loop value of one.

In some embodiments, the pin loop value is indicative of a number of internal conflict spaces associated with a pin loop. Accordingly, the layout router is configured to assign the pin loop value based on the number of virtual conflict spaces associated with the pin loop. It will be appreciated that a number of conflict spaces associated with a pin loop within the net region 180 is determined by analyzing the pin loop. For example, the number of conflict spaces for a pin loop associated with a first pin, a first net, a second pin, and a second net is determined. In FIG. 1, a number of conflict spaces associated with the first pin loop 150 is one, because there is the first conflict space 152 is between the first net 112 and the third net 132. In other words, the number of conflict spaces for the first pin loop 150 is one because the first conflict space 152 of the first pin loop 150 is within the net region 180. Similarly, a number of conflict spaces for the second pin loop 160 is also one because the second conflict space 162 is associated with the second pin loop 160 in the net region 180.

In some embodiments, a total loop count is determined by adding a number of conflict spaces associated with a pin loop to a number of virtual conflict spaces associated with the pin loop. Turning to the first pin loop 150, it is seen that the number of conflict spaces associated with the first pin loop 150 is one because the first conflict space 152 is between the first net 112 and the third net 132. Additionally, a number of virtual conflict spaces associated with the first pin loop 150 is zero, because the pin loop value assigned to the first pin loop 150 is indicative of the number of internal conflict spaces associated with the first pin loop 150 and the first pin loop 150 was assigned a pin loop value of zero. Accordingly, the total loop count for the first pin loop 150 is one because the number of conflict spaces associated with the first pin loop 150 is one and the number of virtual conflict spaces associated with the first pin loop 150 is zero. It will be appreciated that a total loop count for the second pin loop 160 is determined in a similar fashion. For example, the total loop count for the second pin loop 160 is two because the number of conflict spaces associated with the second pin loop 160 is one and the number of virtual conflict spaces associated with the second pin loop 160 is one. Expressed as an equation, the total loop count of a pin loop=a number of conflict spaces associated with the pin loop+a number of virtual conflict spaces associated with the pin loop. It will be appreciated that the total loop count for a pin loop is based on a pin loop value of the pin loop because the pin loop value is indicative of a number of virtual conflict spaces associated with the pin loop, according to some embodiments.

In some embodiments, the layout router is configured to determine a DPT compliance for a pin loop or a DPT violation for the pin loop based on the total loop count for the pin loop. For example, since the total loop count for the first pin loop 150 is one, and the total loop count is an odd number, the layout router assigns a DPT violation to the first pin loop 150. Similarly, for the second pin loop 160, since the total loop count is two, and the total loop count is an even number, the layout router assigns a DPT compliance to the second pin loop 160. In this way, the layout router determines a DPT compliance or a DPT violation based on a total loop count. It will be appreciated that the layout router also determines a DPT compliance or a DPT violation based on a pin loop value because the total loop count is based on the pin loop value, for example. In some embodiments, the layout router is configured to generate a second instance of a first net for a first pin or a second instance of a second net for a second pin based on a determined DPT violation. In other words, the layout router re-generates one or more nets for pins of a pin loop based on a DPT violation for the pin loop.

Figure 2:
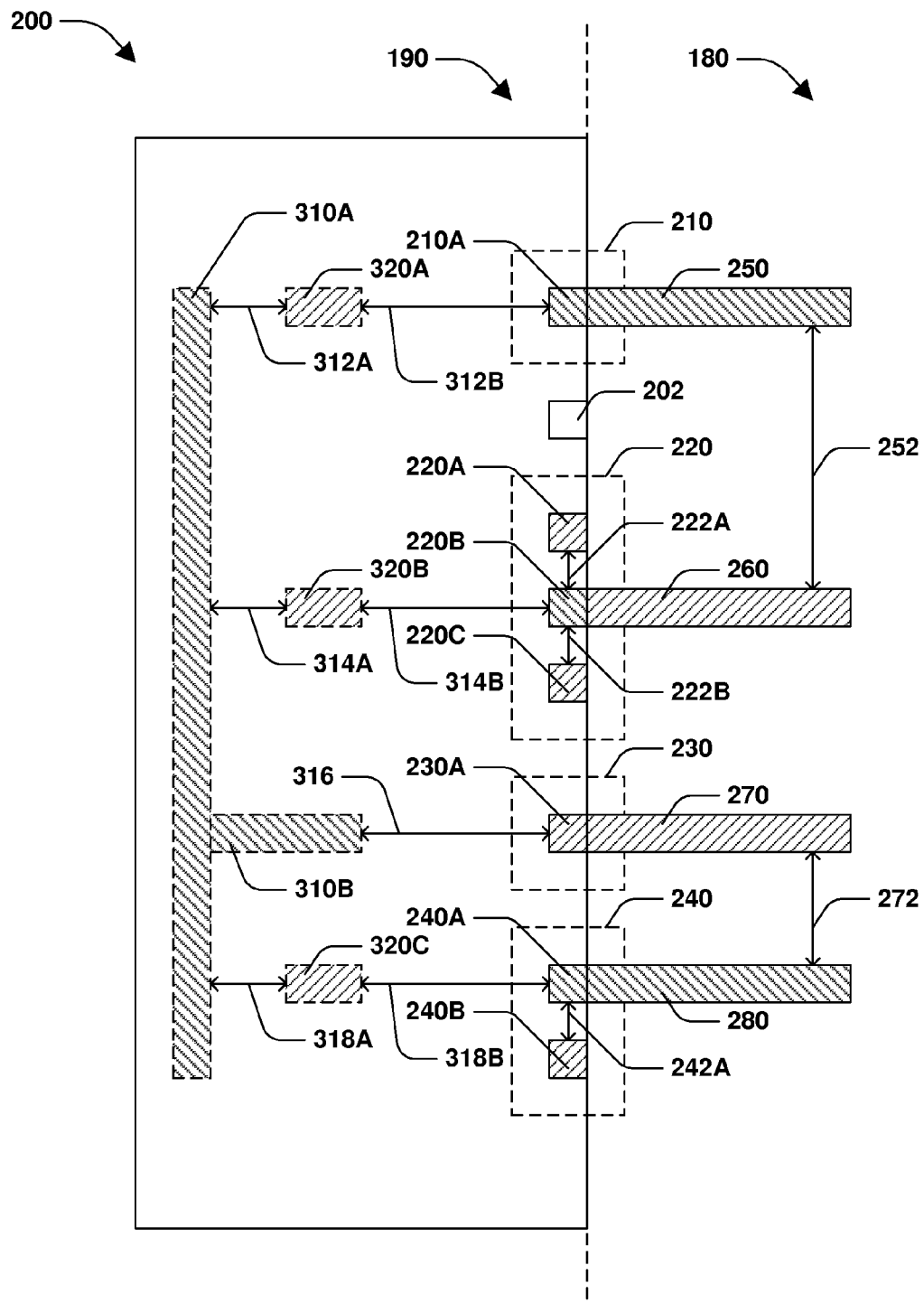
FIG. 2 is a schematic diagram of an example layout associated with a layout router configured for double patterning technology (DPT) routing, according to some embodiments.

FIG. 2 is a schematic diagram 200 of an example layout associated with a layout router configured for double patterning technology (DPT) routing, according to some embodiments. For example, a layout is associated with an internal pin region 190 and a net region 180. The internal pin region 190 is associated with one or more pins. In FIG. 2, the internal pin region 190 is associated with a first pin 210A, a second pin 202, a third pin 220A, a fourth pin 220B, a fifth pin 220C, a sixth pin 230A, a seventh pin 240A, and an eighth pin 240B. The first pin 210A, the fourth pin 220B, and the seventh pin 240A are associated with a mask assignment to a first mask, as indicated by cross hatching. A mask assignment for the second pin 202 is not yet determined. Additionally, the third pin 220A, the fifth pin 220C, the sixth pin 230A, and the eighth pin 240B are associated with a mask assignment to a second mask. One or more internal conflict spaces are between some of the respective pins. For example, internal conflict space 222A is between the third pin 220A and the fourth pin 220B. Internal conflict space 222B is between the fourth pin 220B and the fifth pin 220C. Additionally, internal conflict space 242A is between the seventh pin 240A and the eighth pin 240B. Internal conflict space 222A and internal conflict space 222B are a set of first internal conflict spaces. Similarly, internal conflict space 242A is a set of second internal conflict spaces.

In some embodiments, a layout router is configured to create a pin group based on at least one of a mask assignment for one or more pins of the pin group or one or more internal conflict spaces between at least some of the one or more pins of the pin group. For example, the layout router is configured to create a second pin group 220 in FIG. 2, because the third pin 220A, the fourth pin 220B, and the fifth pin 220C are associated with a mask assignment to at least one of a first mask or a second mask. Additionally, the second pin group 220 is created because the third pin 220A, the fourth pin 220B, and the fifth pin 220C are separated by one or more internal conflict spaces, such as 222A and 222B. In other words, a pin group is defined as a group of pins associated with a mask assignment to a mask and 'linked' or separated by one or more internal conflict spaces. Accordingly, the second pin 202 and the sixth pin 230A are not associated with the second pin group 220 because there is no internal conflict space between the second pin 202 and the third pin 220A or between the fifth pin 220C and the sixth pin 230A. It will be appreciated that the layout router is configured to create one or more other pin groups in a similar fashion. For example, a first pin group 210 comprises the first pin 210A. A third pin group 230 comprises the sixth pin 230A. Additionally, a fourth pin group 240 comprises the seventh pin 240A and the eighth pin 240B.

In some embodiments, the layout router is configured to associate a pin group with at least one of a first phantom assisted feature (AF) mask or a second phantom AF mask. Explained in greater detail, the layout router is configured to associate a pin group with at least one of one or more first phantom AF mask polygons of a first phantom AF mask or one or more second phantom AF mask polygons of a second AF mask. The layout router is configured to randomly select a pin from a pin group and associate the pin with a phantom AF mask opposite of a mask assignment for the pin. For example, the layout router is configured to associate the first pin 210A of the first pin group 210 with a second phantom AF mask polygon 320A because the first pin 210 is associated with a mask assignment to a first mask. Accordingly, the first pin group 210 is associated with the second phantom AF mask because the first pin 210A of the first pin group 210 is linked to the second phantom AF mask polygon 320A of the second phantom AF mask.

In some embodiments, an internal conflict space 312B is between the second phantom AF mask polygon 320A and the first pin 210A. It will be appreciated that the layout router is configured to associate one or more pin groups with at least one of a first phantom AF mask polygon of a first phantom AF mask or a second phantom AF mask polygon of a second phantom AF mask. In this way, the layout router is configured to associate a pin group with at least one of a first phantom AF mask or a second phantom AF mask. In FIG. 2, a pin is selected from the second pin group 220 randomly, such as the fourth pin 220B, for example. The layout router is configured to associate the fourth pin 220B with a second phantom AF mask polygon 320B because the fourth pin 220B is associated with a mask assignment to the first mask, as indicated by the cross hatching. Additionally, an internal conflict space 314B is between the second phantom AF mask polygon 320B and the fourth pin 220B. It will be appreciated that one or more phantom AF mask polygons are associated with the third pin group 230 and the fourth pin group 240 in a similar fashion. For example, the sixth pin 230A is associated with a first phantom AF mask polygon 310B via internal conflict space 316, and the seventh pin 240A is associated with a second phantom AF mask polygon 320C via internal conflict space 318B.

In some embodiments, at least one of the second phantom AF mask polygons 320A, 320B, or 320C is associated or linked to a first phantom AF mask polygon 310A via internal conflict spaces 312A, 314A, or 318A, respectively. For example, the second phantom AF mask polygons 320A, 320B, or 320C are associated with the first phantom AF mask polygon 310A via internal conflict spaces because they are opposite masks, as indicated by the different cross hatching. Conversely, the first phantom AF mask polygon 310B is associated or linked to the first phantom AF mask polygon 310A without an internal conflict space because the first phantom AF mask polygon 310B and the first phantom AF mask polygon 310A are associated with the same first phantom AF mask, as indicated by the same cross hatching.

In some embodiments, the layout router is configured to create one or more first phantom AF mask polygons for the first phantom AF mask. Additionally, the layout router is configured to create one or more second phantom AF mask polygons for the second phantom AF mask. In some embodiments, the first phantom AF mask comprises one or more of the first phantom AF mask polygons. Similarly, the second phantom AF mask comprises one or more of the second phantom AF mask polygons. The layout router is configured to create or insert one or more internal conflict spaces between a pin and a phantom AF mask polygon or between a first phantom AF mask polygon and a second phantom AF mask polygon. However, in some embodiments, an internal conflict space is not inserted between phantom AF mask polygons associated with a same mask, such as between 310B and 310A.

In some embodiments, the layout router is configured to generate one or more nets for one or more pins of a pin group. Explained in another way, for a pin group, the layout router selects a pin of the pin group at random and generates one or more nets for the selected pin. It will be appreciated that a net comprises one or more polygons. However, in FIG. 2, respective nets are represented by a single polygon, although nets comprise additional polygons in some embodiments. For example, the layout router is configured to generate a first net for the first pin 210A. Additionally, the first net comprises a first net polygon 250. It will be appreciated that the layout router is configured to generate one or more corresponding nets for other pins in a similar fashion. For example, the layout router is configured to generate a second net comprising a second net polygon 260 for the fourth pin 220B. For example, the layout router is configured to generate a third net comprising a third net polygon 270 for the sixth pin 230A. For example, the layout router is configured to generate a fourth net comprising a fourth net polygon 280 for the seventh pin 240A. It will be appreciated that some of the one or more generated nets are associated with one or more conflict spaces. When the layout router generates one or more of the nets, a distance, such as a conflict space, between a first net and a second net is sometimes smaller than a lithography limit. For example, in FIG. 2, a first conflict space 252 is associated with the first net polygon 250 and the second net polygon 260. Additionally, a second conflict space 272 is associated with the third net polygon 270 and the fourth net polygon 280. In this way, the first conflict space 252 is between the first net polygon 250 and the second net polygon 260. Similarly, the second conflict space 272 is between the third net polygon 270 and the fourth net polygon 280.

Figure 3:
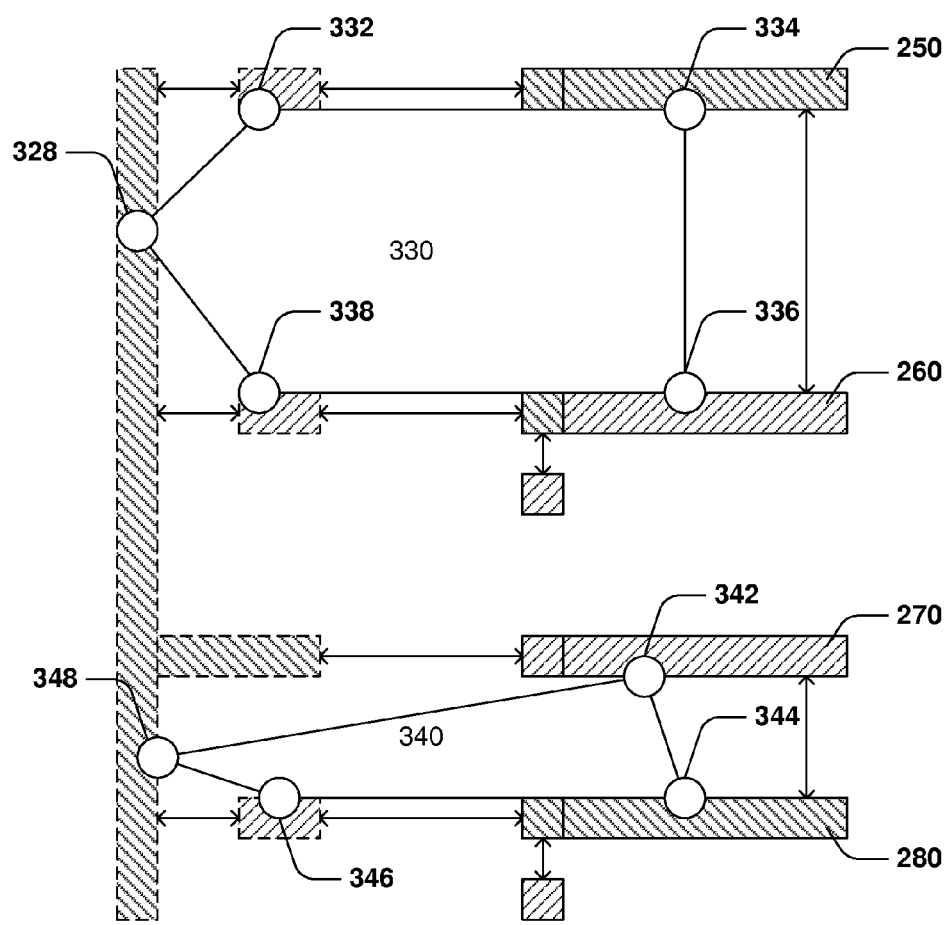
FIG. 3 is a schematic diagram of an example layout associated with a layout router configured for double patterning technology (DPT) routing, according to some embodiments.

FIG. 3 is a schematic diagram 300 of an example layout associated with a layout router configured for double patterning technology (DPT) routing, according to some embodiments. A layout router is configured to create a pin loop based on at least one of a first net, a second net, a first phantom AF mask, a second phantom AF mask, or one or more internal conflict spaces. It will be appreciated that at least one of a net, a phantom AF mask, or a pin is viewed as one or more polygons by the layout router in some embodiments. For example, with reference to FIG. 2, the first net comprises a first net polygon 250, the second net comprises a second net polygon 260, the third net comprises a third net polygon 270, and the fourth net comprises a fourth net polygon 280. The first phantom AF mask comprises one or more first phantom AF mask polygons 310A and 310B. Similarly, the second phantom AF mask comprises one or more second phantom AF mask polygons 320A, 320B, and 320C. In some embodiments, respective pins 210A, 202, 220A, 220B, 220C, 230A, 240A, and 240B are considered as polygons as well. Accordingly, the layout router is configured to create the pin loop based on one or more first phantom AF mask polygons or one or more second phantom AF mask polygons.

The layout router is configured to create the pin loop such that one or more adjacent polygons are associated with a node. A group of one or more polygons are adjacent when no conflict space or internal conflict space is between two polygons of the group of polygons. For example, in FIG. 3, a first pin loop 330 is created by the layout router. Here, the first phantom AF mask polygon 310A of FIG. 2. Is a first node 328 for the first pin loop 330 because internal conflict spaces 312A and 314A are between the first phantom AF mask polygon 310A and the second phantom AF mask polygons 320A and 320B, respectively. It will be appreciated that one or more nodes for the pin loop 330 are created in a similar fashion. For example, a second node 332 for the first pin loop 330 is created based on the second phantom AF mask polygon 320A between internal conflict spaces 312A and 312B. In this way, the second node 332 is associated with the second phantom AF mask polygon 320A. A third node 334 for the first pin loop 330 is created based on the first pin 210A and the first net polygon 250 because 210A and 250 are between internal conflict space 312B and conflict space 252. In this way, the third node 334 is associated with respective polygons 210A and 250. Additionally, a fourth node 336 for the first pin loop 330 is created or associated with polygons 220B and 260. It will be appreciated that polygons 220A and 220C are not associated with the first pin loop 330 because respective polygons are associated with merely one internal conflict space 222A and 222B, respectively. In some embodiments, a polygon associated with merely a single conflict space or merely a single internal conflict space is not included in the pin loop because the polygon is dangling from the pin loop. At 338, a fifth node is associated with the second phantom AF mask polygon 320B. It will be appreciated that the second pin loop 340 and corresponding nodes are created in a similar fashion. Accordingly, the second pin loop 340 comprises a first node 342, a second node 344, a third node 346, and a fourth node 348. In some embodiments, a conflict space or an internal conflict space is an edge for a pin loop. A layout router is configured to assign a pin loop value to a pin loop based on a number of edges associated with the pin loop. In some embodiments, the layout router is configured to assign a pin loop value to a pin loop based on a number of internal conflict spaces associated with the pin loop and a number of conflict spaces associated with the pin loop. In other words, the pin loop value is determined by a number of edges associated with the pin loop, because an edge of a pin loop is at least one of a conflict space or an internal conflict space.

In some embodiments, the layout router is configured to assign a pin loop value to the pin loop based on a number of nodes associated with the pin loop. For example, for the first pin loop 330, a pin loop value of five is assigned because the first pin loop 330 comprises five nodes 328, 332, 334, 336, and 338. Similarly, for the second pin loop 340, a pin loop value of four is assigned because the second pin loop 340 comprises four nodes 342, 344, 346, and 348.

In some embodiments, the layout router is configured to determine at least one of a double patterning technology (DPT) compliance for the pin loop or a DPT violation for the pin loop based on the pin loop value. For example, the layout router is configured to determine a DPT compliance for a pin loop based on an even pin loop value for the pin loop. Conversely, the layout router is configured to determine a DPT violation for a pin loop based on an odd pin loop value for the pin loop.

Figure 4:
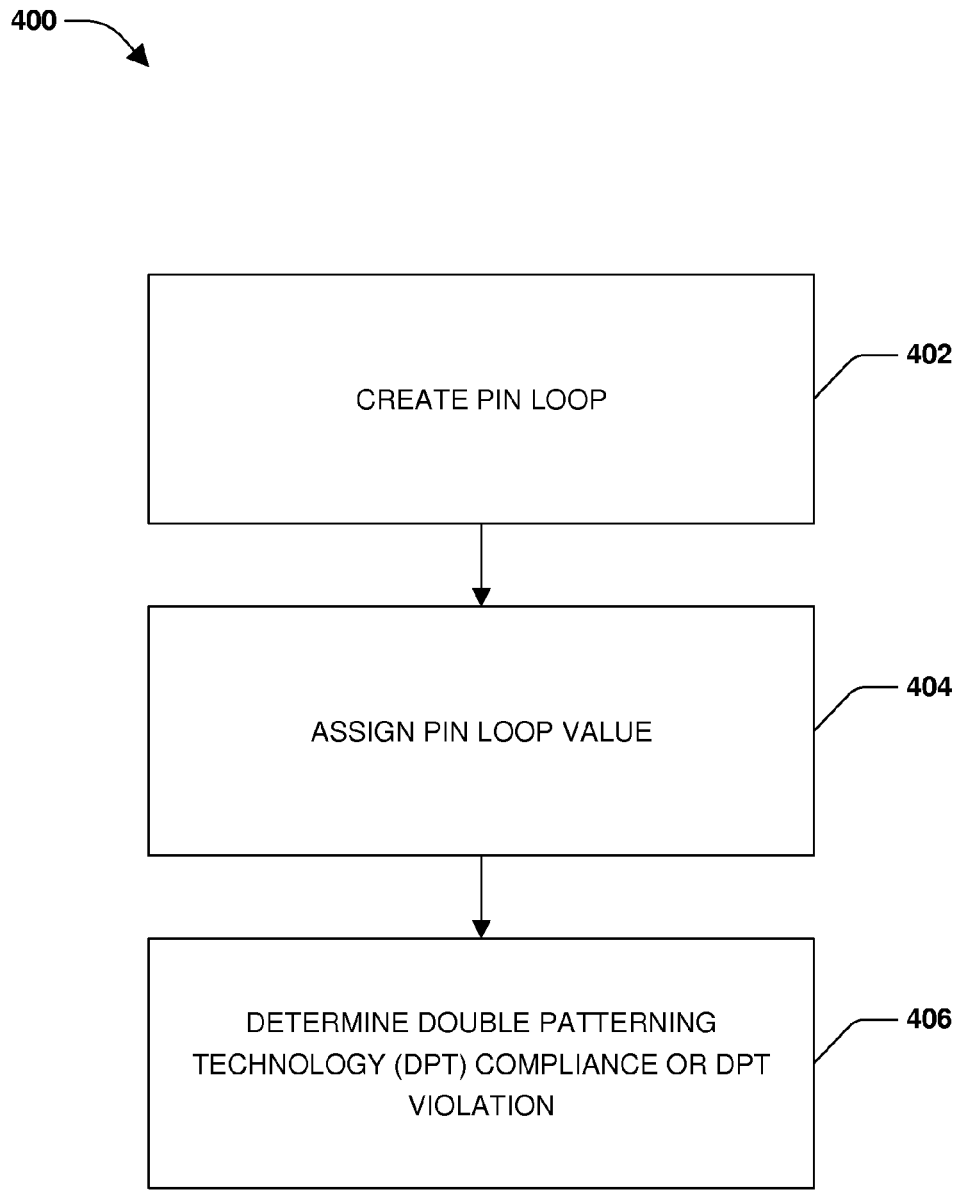
FIG. 4 is a flow diagram of an example method for determining double patterning technology (DPT) layout routing compliance, according to some embodiments.

FIG. 4 is a flow diagram of an example method 400 for determining double patterning technology (DPT) layout routing compliance, according to some embodiments. For example, at 402, the method 400 comprises creating a pin loop based on at least one of a first pin associated with a first net, a second pin associated with a second net, or a conflict space associated with the first net and the second net. At 404, the method 400 comprises assigning a pin loop value to the pin loop based on at least one of a mask assignment for the first pin or a mask assignment for the second pin. At 406, the method 400 comprises determining at least one of a double patterning technology (DPT) compliance for the pin loop or a DPT violation for the pin loop based on the pin loop value.

Figure 5:
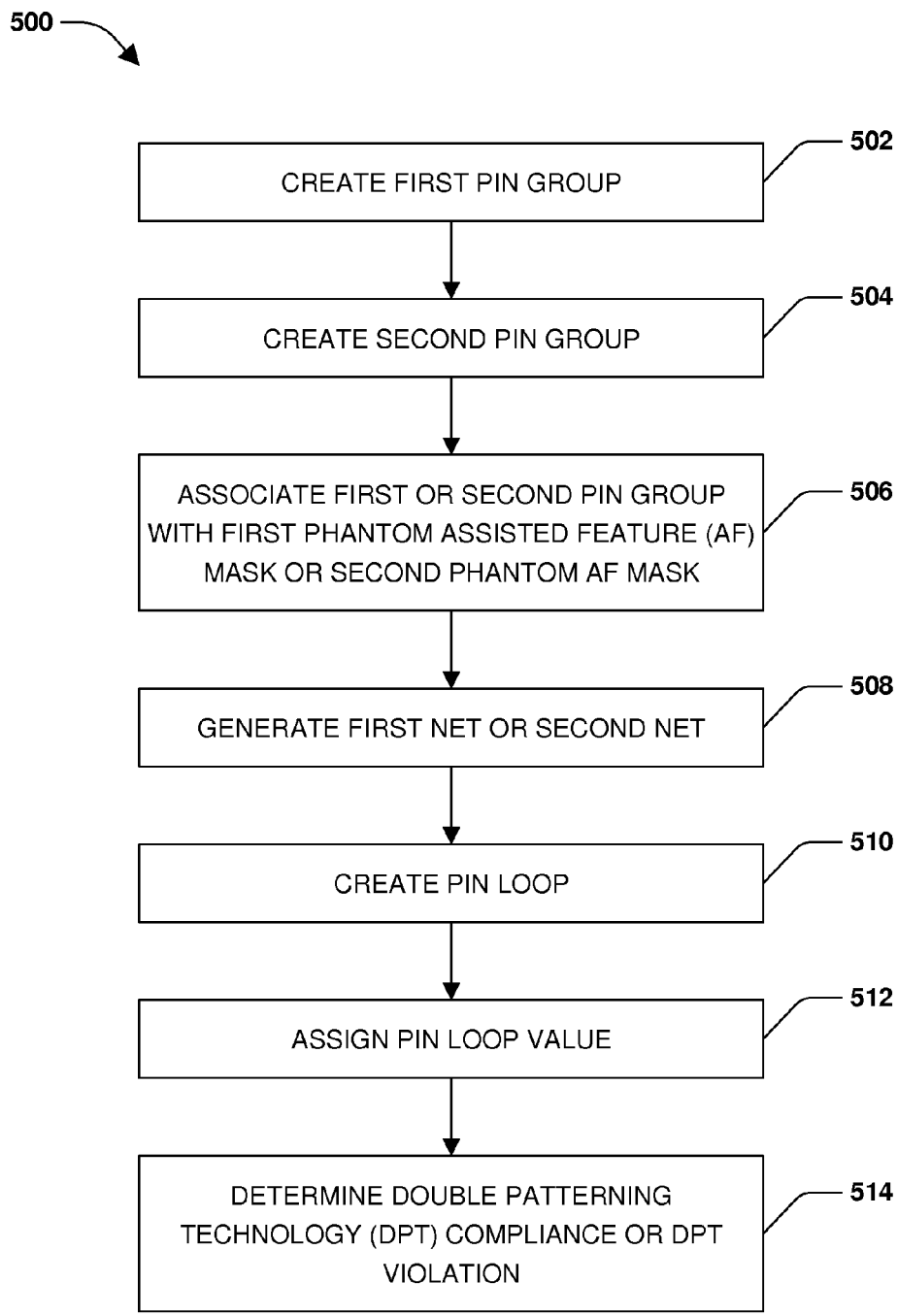
FIG. 5 is a flow diagram of an example method for determining double patterning technology (DPT) layout routing compliance, according to some embodiments.

FIG. 5 is a flow diagram of an example method 500 for determining double patterning technology (DPT) layout routing compliance, according to some embodiments. At 502, the method 500 comprises creating a first pin group based on at least one of a mask assignment for one or more pins of the first pin group or one or more first internal conflict spaces between at least some of the one or more pins of the first pin group. At 504, the method 500 comprises creating a second pin group based on at least one of a mask assignment for one or more pins of the second pin group or one or more second internal conflict spaces between at least some of the one or more pins of the second pin group. At 506, the method 500 comprises associating at least one of the first pin group or the second pin group with at least one of a first phantom assisted feature (AF) mask or a second phantom AF mask. At 508, the method 500 comprises generating at least one of a first net for a pin of the first pin group or a second net for a pin of the second pin group. At 510, the method 500 comprises creating a pin loop based on at least one of the first net, the second net, the first phantom AF mask, the second phantom AF mask, at least some of the one or more first internal conflict spaces, or at least some of the one or more second internal conflict spaces. At 512, the method 500 comprises assigning a pin loop value to the pin loop based on a number of nodes associated with the pin loop. At 514, the method 500 comprises determining at least one of a double patterning technology (DPT) compliance for the pin loop or a DPT violation for the pin loop based on the pin loop value.

Figure 6:
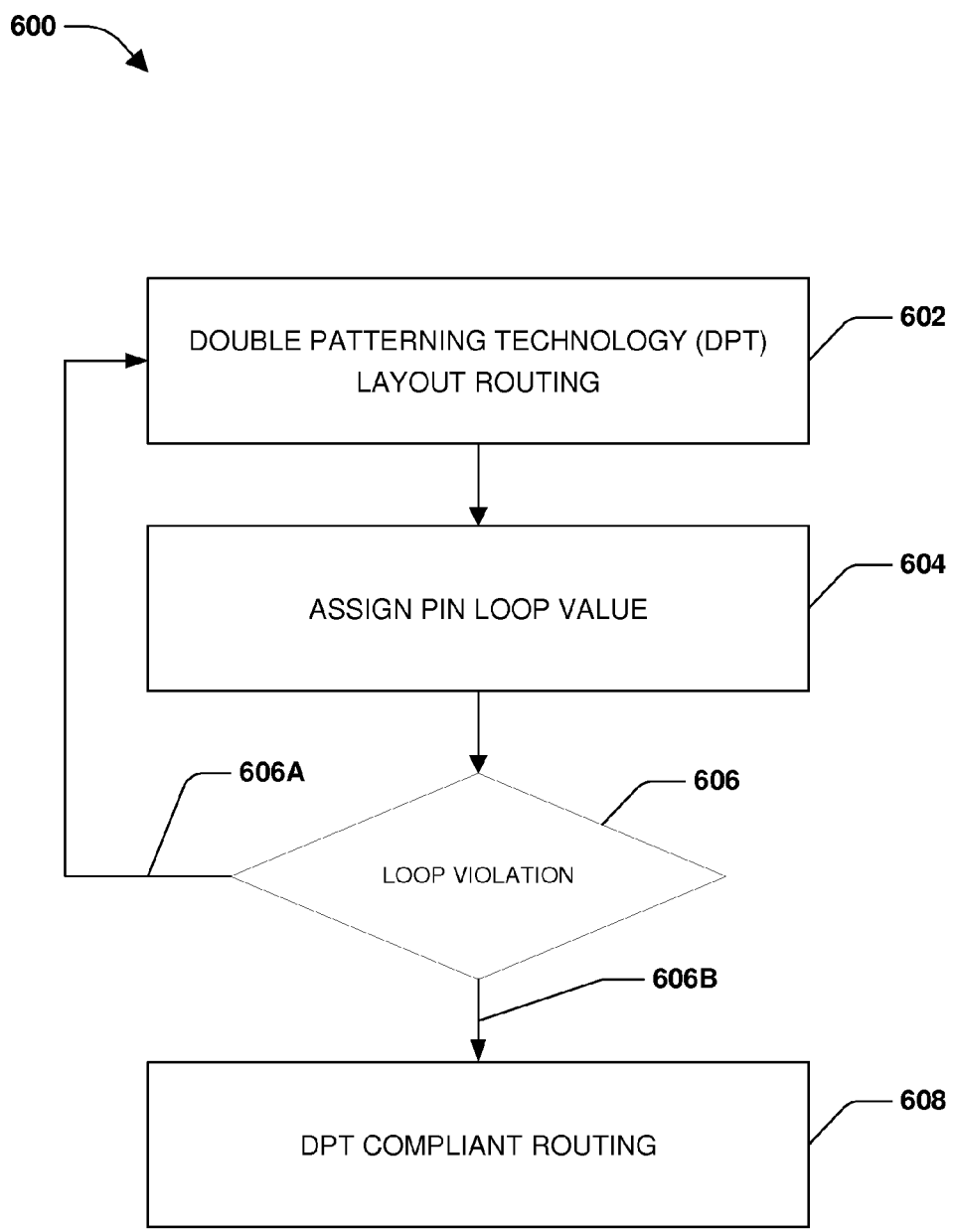
FIG. 6 is a flow diagram of an example method for double patterning technology (DPT) layout routing, according to some embodiments.

FIG. 6 is a flow diagram of an example method 600 for double patterning technology (DPT) layout routing, according to some embodiments. At 602, the method 600 comprises double patterning technology (DPT) layout routing. For example, layout routing comprises creating one or more nets for one or more pins. Additionally, layout routing comprises creating one or more pin loops, for example. At 604, a pin loop value is assigned to a pin loop. At 606, the pin loop is checked for a loop violation. If there is a loop violation, layout routing is done via 606A, such as until no violation exists. When no loop violation is found at 606B, DPT compliant layout routing is achieved at 608.

Figure 7:
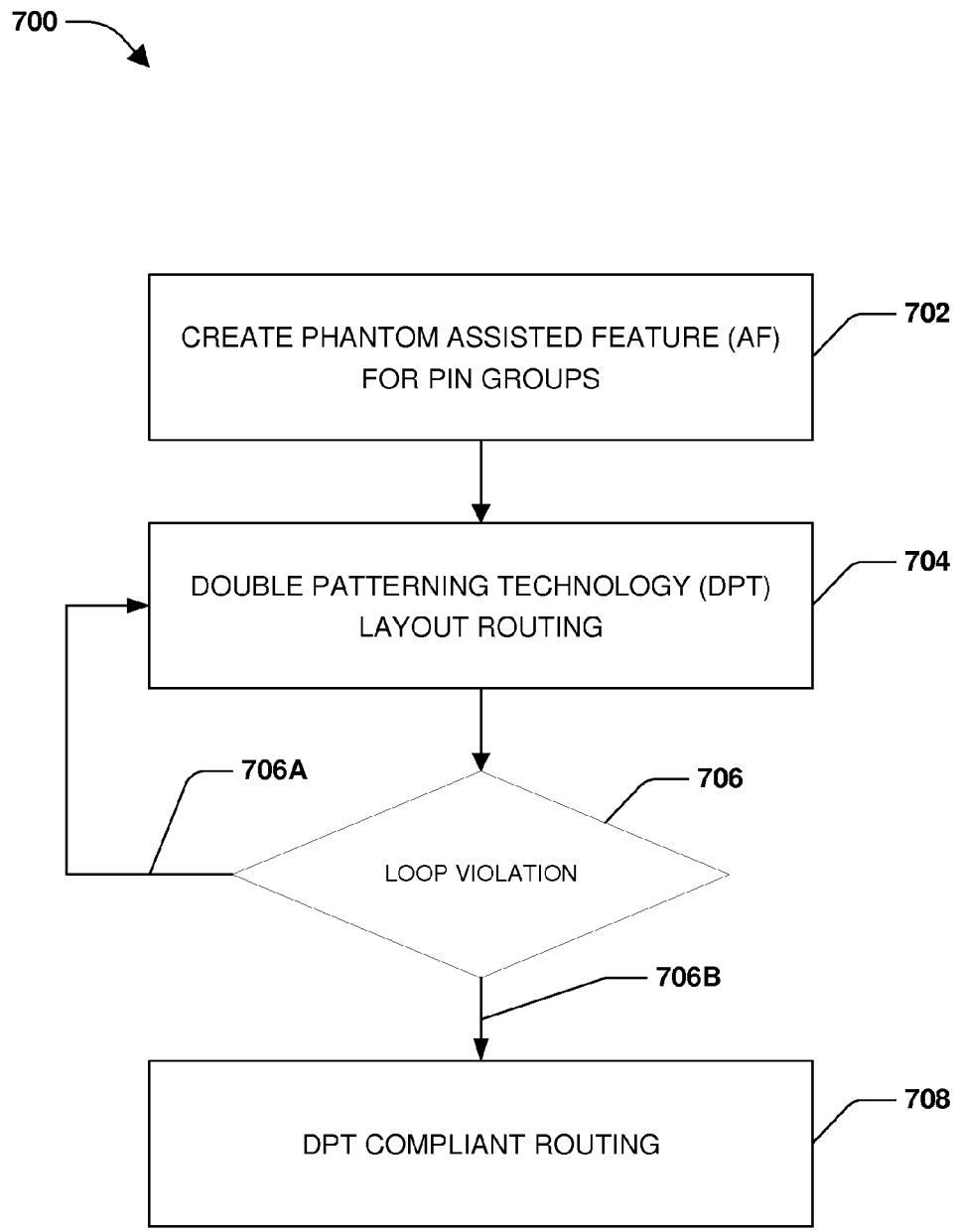
FIG. 7 is a flow diagram of an example method for double patterning technology (DPT) layout routing, according to some embodiments.

FIG. 7 is a flow diagram of an example method 700 for double patterning technology (DPT) layout routing, according to some embodiments. In some embodiments, one or more phantom assisted feature (AF) masks are created for one or more pin groups at 702. For example, a phantom AF mask comprises one or more phantom AF mask polygons. At 704, layout routing occurs. For example, layout routing comprises creating one or more nets for one or more pins, creating one or more pin loops, or assigning a pin loop value to a pin loop. At 706, the pin loop is checked for a loop violation. If there is a loop violation, layout routing is repeated via 706A. When no loop violation is found at 706B, DPT compliant layout routing is achieved at 708.

Figure 8:
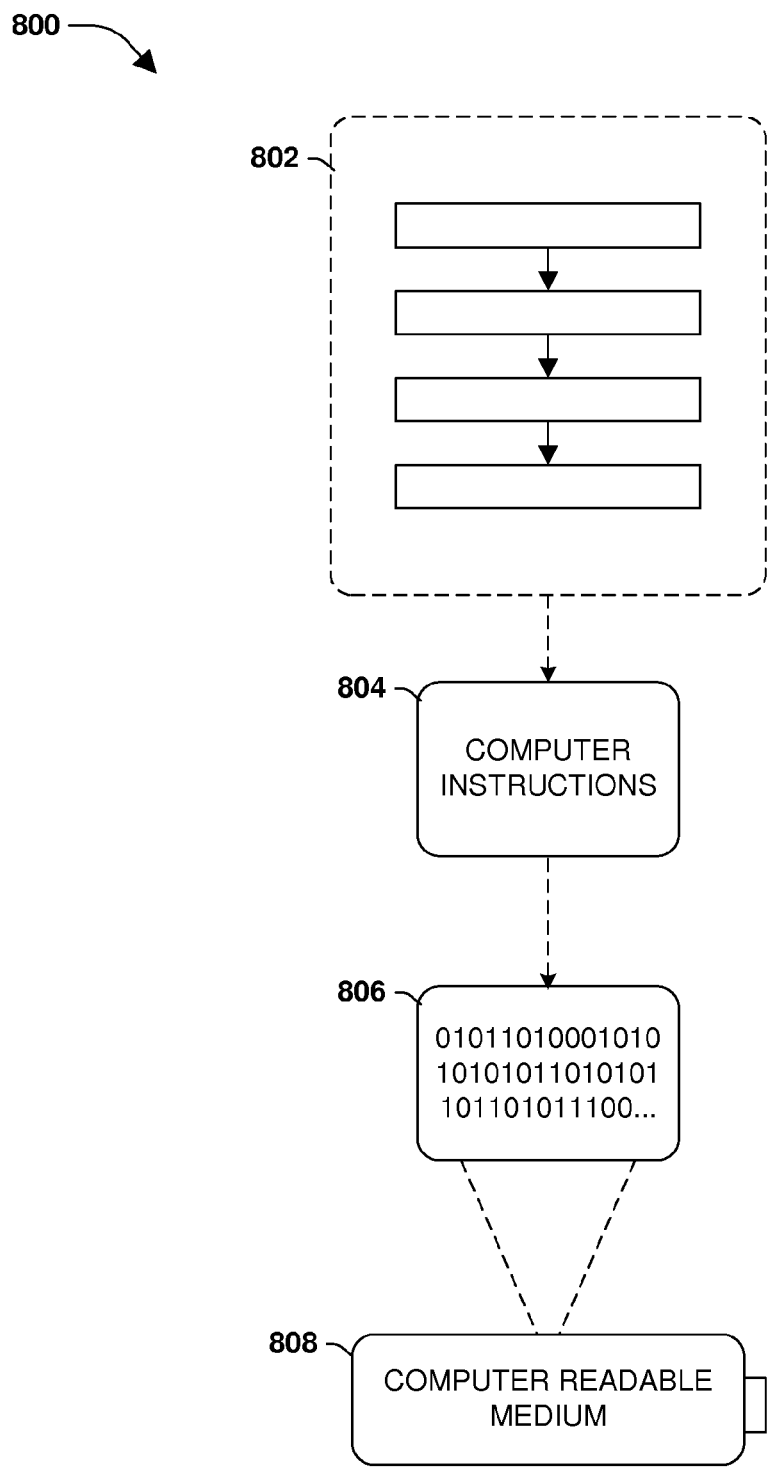
FIG. 8 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein an implementation 800 comprises a computer-readable medium 808, such as a CD-R, DVD-R, flash drive, a platter of a hard disk drive, etc., on which is encoded computer-readable data 806. This computer-readable data 806, such as binary data comprising a plurality of zero's and one's as shown in 806, in turn comprises a set of computer instructions 804 configured to operate according to one or more of the principles set forth herein. In one such embodiment 800, the processor-executable computer instructions 804 is configured to perform a method 802, such as at least some of the exemplary method 400 of FIG. 4 or at least some of exemplary method 500 of FIG. 5, for example. In another embodiment, the processor-executable instructions 804 are configured to implement a system. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
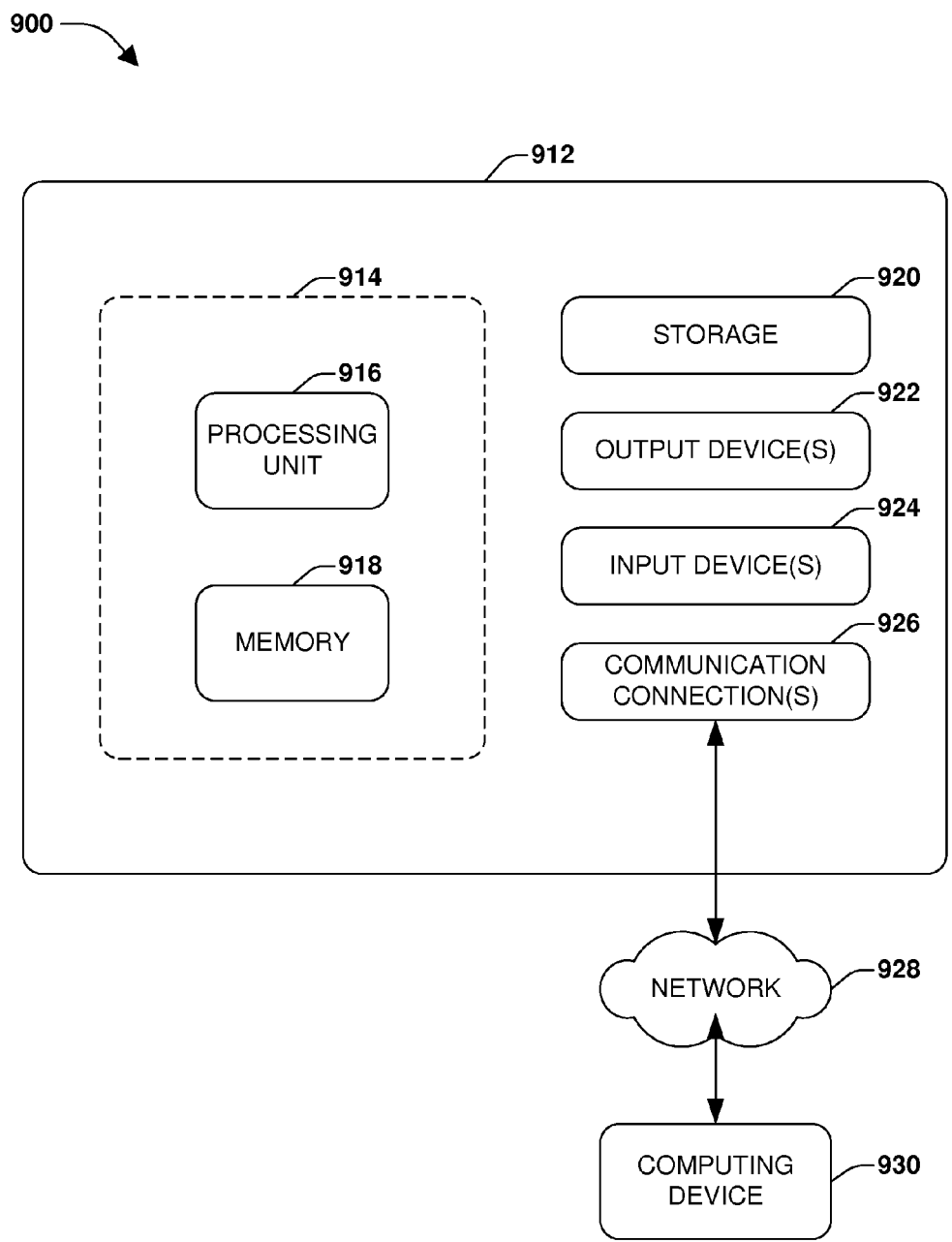
FIG. 9 is an illustration of an example computing environment where one or more of the provisions set forth herein are implemented, according to some embodiments.

FIG. 9 and the following discussion provide a description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. Depending on the exact configuration and type of computing device, memory 918 may be volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

According to some aspects, a system for determining double patterning technology (DPT) layout routing compliance is provided. The system comprises a processor, a memory, and a layout routing component. The layout routing component comprises instructions stored in the memory, that when executed on the processor, cause the system to create a pin loop based on at least one of a first pin associated with a first net, a second pin associated with a second net, or a conflict space associated with the first net and the second net. The layout routing component comprises instructions stored in the memory, that when executed on the processor, cause the system to assign a pin loop value to the pin loop based on at least one of a mask assignment for the first pin or a mask assignment for the second pin. The layout routing component comprises instructions stored in the memory, that when executed on the processor, cause the system to determine at least one of a double patterning technology (DPT) compliance for the pin loop or a DPT violation for the pin loop based on the pin loop value.

According to some aspects, a computer-readable storage medium is provided. The computer-readable storage medium comprises computer-executable instructions, which when executed at least in part via a processing unit on a computer performs acts, comprising creating a first pin group based on at least one of a mask assignment for one or more pins of the first pin group or one or more first internal conflict spaces between at least some of the one or more pins of the first pin group. In some embodiments, the computer-readable storage medium comprises creating a second pin group based on at least one of a mask assignment for one or more pins of the second pin group or one or more second internal conflict spaces between at least some of the one or more pins of the second pin group. In some embodiments, the computer-readable storage medium comprises associating at least one of the first pin group or the second pin group with at least one of a first phantom assisted feature (AF) mask or a second phantom AF mask. In some embodiments, the computer-readable storage medium comprises generating at least one of a first net for a pin of the first pin group or a second net for a pin of the second pin group. In some embodiments, the computer-readable storage medium comprises creating a pin loop based on at least one of the first net, the second net, the first phantom AF mask, the second phantom AF mask, at least some of the one or more first internal conflict spaces, or at least some of the one or more second internal conflict spaces. In some embodiments, computer-readable storage medium comprises assigning a pin loop value to the pin loop based on a number of nodes associated with the pin loop. In some embodiments, the computer-readable storage medium comprises determining at least one of a double patterning technology (DPT) compliance for the pin loop or a DPT violation for the pin loop based on the pin loop value.

According to some aspects, a method for determining double patterning technology (DPT) layout routing compliance is provided, on a device having a processor. The method comprises executing, on the processor, instructions for creating a first pin group based on at least one of a mask assignment for one or more pins of the first pin group or one or more first internal conflict spaces between at least some of the one or more pins of the first pin group. In some embodiments, the method comprises creating a second pin group based on at least one of a mask assignment for one or more pins of the second pin group or one or more second internal conflict spaces between at least some of the one or more pins of the second pin group. In some embodiments, the method comprises associating at least one of the first pin group or the second pin group with at least one of a first phantom assisted feature (AF) mask or a second phantom AF mask. In some embodiments, the method comprises generating at least one of a first net for a pin of the first pin group or a second net for a pin of the second pin group. In some embodiments, the method comprises creating a pin loop based on at least one of the first net, the second net, the first phantom AF mask, the second phantom AF mask, at least some of the one or more first internal conflict spaces, or at least some of the one or more second internal conflict spaces. In some embodiments, the method comprises assigning a pin loop value to the pin loop based on a number of nodes associated with the pin loop. In some embodiments, the method comprises determining at least one of a double patterning technology (DPT) compliance for the pin loop or a DPT violation for the pin loop based on the pin loop value.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A system for determining double patterning technology (DPT) layout routing compliance, comprising:
a layout routing component configured to:
create a first pin group comprising a first set of one or more pre-colored pins that are linked together by a first set of internal conflict spaces;
associate the first pin group with a first phantom assisted feature (AF) mask polygon, the associating comprising:
selecting a first pre-colored pin from the first set of one or more pre-colored pins;
determining a first mask assignment associated with the first pre-colored pin; and
assigning the first phantom AF mask polygon to a different mask than a mask for the first pre-colored pin according to the first mask assignment;
create a pin loop based on the first pre-colored pin and the phantom AF mask polygon;
assign a pin loop value to the pin loop; and
determine whether a double patterning technology (DPT) violation is present for the pin loop based on the pin loop value.

2. The system of claim 1, the associating comprising:
generating the first phantom AF mask polygon, a spacing between the first phantom AF mask polygon less than a lithography limit to create an internal conflict space between the first phantom AF mask polygon and the first pre-colored pin.

3. The system of claim 1, the layout routing component configured to:
generate a first net for the first pre-colored pin.

4. The system of claim 1, the layout routing component configured to:
create a second pin group comprising a second set of one or more pre-colored pins that are linked together by a second set of internal conflict spaces;
associate the second pin group with a second phantom AF mask polygon, the associating comprising:
selecting a second pre-colored pin from the second set of one or more pre-colored pins; and
determining a second mask assignment associated with the second pre-colored pin; and assigning the second phantom AF mask polygon to a different mask than a mask for the second pre-colored pin according to the second mask assignment.

5. The system of claim 4, the layout routing component configured to:
   generate a first net for the first pre-colored pin; and
   generate a second net for the second pre-colored pin.

6. The system of claim 5, the layout routing component configured to:
   create the pin loop based on the second pre-colored pin and the second phantom AF mask polygon when a spacing between the first net and the second net is less than a lithography limit, creating an internal conflict space between the first net and the second net.

7. The system of claim 5, the layout routing component configured to:
   create a second pin loop based on the second pre-colored pin and the second phantom AF mask polygon when a spacing between the first net and the second net exceeds a lithography limit, creating no internal conflict space between the first net and the second net.

8. The system of claim 1, the layout routing component configured to:
   determine that double patterning technology (DPT) violation is present for the pin loop when the pin loop value is an odd number.

9. A computer-readable storage medium comprising computer-executable instructions, which when executed at least in part via a processing unit performs acts, comprising:
   creating a first pin group based on at least one of a mask assignment for one or more pins of the first pin group or one or more first internal conflict spaces between at least some of the one or more pins of the first pin group;
   creating a second pin group based on at least one of a mask assignment for one or more pins of the second pin group or one or more second internal conflict spaces between at least some of the one or more pins of the second pin group;
   associating at least one of the first pin group or the second pin group with at least one of a first phantom assisted feature (AF) mask or a second phantom AF mask;
   generating at least one of a first net for a pin of the first pin group or a second net for a pin of the second pin group;
   creating a pin loop based on at least one of the first net, the second net, the first phantom AF mask, the second phantom AF mask, at least some of the one or more first internal conflict spaces, or at least some of the one or more second internal conflict spaces;
   assigning a pin loop value to the pin loop based on a number of nodes associated with the pin loop; and
   determining at least one of a double patterning technology (DPT) compliance for the pin loop or a DPT violation for the pin loop based on the pin loop value.

10. The computer-readable storage medium of claim 9, comprising creating at least one of one or more first phantom AF mask polygons for the first phantom AF mask or one or more second phantom AF mask polygons for the second phantom AF mask.

11. The computer-readable storage medium of claim 10, comprising associating at least one of the first pin group or the second pin group with at least one of:
   at least some of the one or more first phantom AF mask polygons; or
   at least some of the one or more second phantom AF mask polygons.

12. The computer-readable storage medium of claim 10, comprising creating the pin loop based on at least one of:
   at least some of the one or more first phantom AF mask polygons; or
   at least some of the one or more second phantom AF mask polygons.

13. The computer-readable storage medium of claim 9, comprising determining the DPT compliance based on an even pin loop value.

14. The computer-readable storage medium of claim 9, comprising determining the DPT violation based on an odd pin loop value.

15. The computer-readable storage medium of claim 9, comprising assigning the pin loop value to the pin loop based on a number of edges associated with the pin loop.

16. The computer-readable storage medium of claim 9, comprising assigning the pin loop value to the pin loop based on a number of internal conflict spaces associated with the pin loop and a number of conflict spaces associated with the pin loop.

17. A method for determining double patterning technology (DPT) layout routing compliance using a device having a processor, the method comprising:
   executing on the processor, instructions for:
   creating a first pin group based on at least one of a mask assignment for one or more pins of the first pin group or one or more first internal conflict spaces between at least some of the one or more pins of the first pin group;
   creating a second pin group based on at least one of a mask assignment for one or more pins of the second pin group or one or more second internal conflict spaces between at least some of the one or more pins of the second pin group;
   associating at least one of the first pin group or the second pin group with at least one of a first phantom assisted feature (AF) mask or a second phantom AF mask;
   generating at least one of a first net for a pin of the first pin group or a second net for a pin of the second pin group;
   creating a pin loop based on at least one of the first net, the second net, the first phantom AF mask, the second phantom AF mask, at least some of the one or more first internal conflict spaces, or at least some of the one or more second internal conflict spaces;
   assigning a pin loop value to the pin loop based on a number of nodes associated with the pin loop; and
   determining at least one of a double patterning technology (DPT) compliance for the pin loop or a DPT violation for the pin loop based on the pin loop value.

18. The method of claim 17, comprising determining the DPT compliance based on an even pin loop value.

19. The method of claim 17, comprising determining the DPT violation based on an odd pin loop value.

20. The method of claim 17, comprising creating at least one of one or more first phantom AF mask polygons for the first phantom AF mask or one or more second phantom AF mask polygons for the second phantom AF mask.

* * * * *